(12) United States Patent
Chou et al.

(10) Patent No.: US 7,838,777 B2
(45) Date of Patent: Nov. 23, 2010

(54) SIGNAL TRANSMISSION STRUCTURE, PACKAGE STRUCTURE AND BONDING METHOD THEREOF

(75) Inventors: Chia-Hsing Chou, Kaohsiung (TW); Chih-Yi Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 925 days.

(21) Appl. No.: 11/620,430

(22) Filed: Jan. 5, 2007

(65) Prior Publication Data

US 2007/0221403 A1 Sep. 27, 2007

(30) Foreign Application Priority Data

Mar. 27, 2006 (TW) .............................. 95110496 A

(51) Int. Cl.
 *H01R 12/04* (2006.01)
 *H05K 1/11* (2006.01)
(52) U.S. Cl. ..................... 174/262; 174/261
(58) Field of Classification Search .......... 174/260–266
 See application file for complete search history.

(56) References Cited

U.S. PATENT DOCUMENTS

| | | | | |
|---|---|---|---|---|
| 6,812,412 B2 * | 11/2004 | Obata et al. | ................. | 174/261 |
| 6,969,808 B2 * | 11/2005 | Shiraki | ...................... | 174/255 |
| 7,404,250 B2 * | 7/2008 | Cheng et al. | .................. | 29/852 |
| 7,408,120 B2 * | 8/2008 | Kim et al. | ................... | 174/262 |

* cited by examiner

*Primary Examiner*—Ishwarbhai B Patel
(74) *Attorney, Agent, or Firm*—J.C. Patents

(57) ABSTRACT

A signal transmission structure including a first signal pad, a first reference plane surrounding the first signal pad, a second signal pad, a second reference plane surrounding the second signal pad, an electric conductive element, and a conductive wall is provided. The second reference plane is parallel to the first reference plane, and the electrical conductive element is connected between the first signal pad and the second signal pad to transmit a signal. The conductive wall is connected between the first reference plane and the second reference plane and surrounding the electrical conductive element. Furthermore, a package structure applying to the signal transmission structure and a bonding method thereof are provided.

8 Claims, 5 Drawing Sheets

SIGNAL TRANSMISSION STRUCTURE, PACKAGE STRUCTURE AND BONDING METHOD THEREOF

CROSS-REFERENCE TO RELATED APPLICATION

This application claims the priority benefit of Taiwan application serial no. 95110496, filed Mar. 27, 2006. All disclosure of the Taiwan application is incorporated herein by reference.

BACKGROUND OF THE INVENTION

1. Field of the Invention

The present invention relates to a signal transmission structure, more particularly, the present invention relates to a signal transmission structure of preventing an internal signal thereof from Electromagnetic Interference (EMI).

2. Description of Related Art

At present market, an electronic apparatus having a signal transmission structure therein is utilized to transmit signals in the electronic apparatus. In general, there is a high-density electronic device installed in the electronic apparatus, therefore, it is easy to generate Electromagnetic Interference (EMI) between the signal transmission structure and other electronic devices when transmitting the signals and further effect the signal transmission quality.

For example, in the semiconductor industry, the integrated circuit (IC) chip manufacturers usually produce high integration, multifunction and high speed IC chip by improving the clock frequency, the wiring density and the number of the I/O terminals. Generally, such an integrated circuit chip is electrically connected to a circuit board through a chip carrier in order to transmit the electronic signal between the integrated circuit chip and the circuit board. Nevertheless, the electronic signal is effected easily by EMI as the increasing clock frequency of integrated circuit chip.

FIG. 1 is a schematic view of a conventional package structure. Referring to FIG. 1, the conventional package structure 100 includes a carrier 110 used to carry a chip 10, a circuit board 120 parallel to the carrier 110, and a solder ball 130 that is electrically connected between a contact 112 of the carrier 110 and a contact 122 of the circuit board 120. Consequently, the electronic signal can transmit through the solder ball 130 between the chip 10 and circuit board 120.

It is to be noted that the carrier 110 is electrically connected to the circuit board 120 as well as parallel to the circuit board 120; thus, the carrier 110 and the circuit board 120 will form a resonant cavity. That is, if the clock frequency of the transmitting signal between the chip 10 and the circuit board 120 happens to the resonant frequency of the resonant cavity, parts of energy of the signal will transmit to the resonant cavity and the amplitude of the signal will be significantly decreased. It further causes poor signal transmission quality between the chip 100 and circuit board 120.

Moreover, when there is a noise happened in the carrier 110 and circuit 120 as well as the frequency of such noise is equivalent to the resonant frequency of the resonant cavity between the carrier 110 and the circuit board 120, the noise will interfere with the signal through the resonant cavity to cause the poor signal transmission quality between the chip 10 and the circuit board 120.

SUMMARY OF THE INVENTION

The present invention is directed to providing a signal transmission structure to resolve the poor signal quality between two reference planes.

The present invention is also directed to providing a package structure, in which good signal transmission quality between two parallel substrates is achieved.

The present invention is further directed to providing a bonding method to fabricate the aforementioned package structure.

In order to achieve the above objectives or the other, a signal transmission structure including a first signal pad, a first reference plane surrounding the first signal pad, a second signal pad, a second reference plane surrounding the second signal pad, an electric conductive element, and a conductive wall is provided in the present invention. The second reference plane is parallel to the first reference plane, and the electrical conductive element is connected between the first signal pad and the second signal pad to transmit a signal. The conductive wall is connected between the first reference plane and the second reference plane as well as surrounding the electrical conductive element.

According to the present invention, a package structure is further provided to include a first substrate, a second substrate, an electrical conductive element and a conductive wall. The first substrate includes a first signal pad, a first reference plane and a first solder mask layer, wherein the first reference plane is surrounding the first signal pad and the first solder mask layer is disposed on the first reference plane and the first signal pad is exposed by the first solder mask layer; and the first solder mask layer is having a first annular opening surrounding the first signal pad to expose a part of the first reference plane. Furthermore, the second substrate includes a second signal pad, a second reference plane and a second solder mask layer, wherein the second reference plane is surrounding the second signal pad and the second solder mask layer is disposed on the second reference plane and the second signal pad is exposed by the second solder mask layer; and the second solder mask layer has a second annular opening surrounding the second signal pad to expose a part of the second reference plane. Moreover, the electrical conductive element is connected between the first signal pad and the second signal pad in order to transmit a signal. The conductive wall is connected between the first reference plane exposed by the first solder mask layer and the second reference plane exposed by the second solder mask layer as well as surrounding the electrical conductive element.

In the aforementioned circuit transmission structure and circuit substrate, the first reference plane and the second reference plane are ground planes, for example.

In the aforementioned circuit transmission structure and circuit substrate, the first reference plane and the second reference plane are power planes, for example.

In the aforementioned circuit transmission structure and circuit substrate, the electrical conductive element is a metal ball, for example.

In the aforementioned circuit transmission structure and circuit substrate, the signal frequency is more than 1 GHz, for example.

In the aforementioned circuit transmission structure and circuit substrate, the conductive wall can form a sealed space.

In a preferred embodiment of the present invention, the first substrate is a circuit substrate or a printed circuit board (PCB).

In a preferred embodiment of the present invention, the second substrate is the circuit substrate or a printed circuit board (PCB).

According to the present invention, a bonding method is further provided to bonding the first substrate and the second substrate of the aforementioned package structure and the bonding method includes the following steps. Firstly, a first conductive material is disposed on the first signal pad and/or a second signal pad. Meanwhile, a second conductive material is disposed on the first reference plane and/or the second reference plane of the periphery of the first conductive material. Then, the first conductive material is connected between the first signal pad and the second signal pad by bonding the first substrate and the second substrate. Meanwhile, the second conductive material is connected between the first reference plane and the second reference plane to form the conductive wall that is surrounding the first conductive material.

In a preferred embodiment of the present invention, the step of bonding the first substrate and the second substrate further comprises reflowing the first conductive material and the second conductive material.

In a preferred embodiment of the present invention, the step of disposing the first conductive material comprises disposing a first metal ball on the first signal pad and/or the second signal pad.

In a preferred embodiment of the present invention, the step of disposing the second conductive material comprises disposing a plurality of the second metal balls on the first reference plane and/or the second reference plane.

In a preferred embodiment of the present invention, the step of disposing the second conductive material comprises spraying a solder paste on the first reference plane and/or the second reference plane.

The signal transmission structure of the present invention is to dispose a conductive wall in the periphery of the electrical conductive element connected between the first signal pad and the second signal pad. A good quality of the signal transmitting between the first reference plane and the second reference plane can be obtained by means of the conductive wall that is surrounding the electric conductive element.

In order to the make aforementioned and other objects, features and advantages of the present invention comprehensible, a preferred embodiment accompanied with figures is described in detail below.

DESCRIPTION OF EMBODIMENTS

Figure 1:
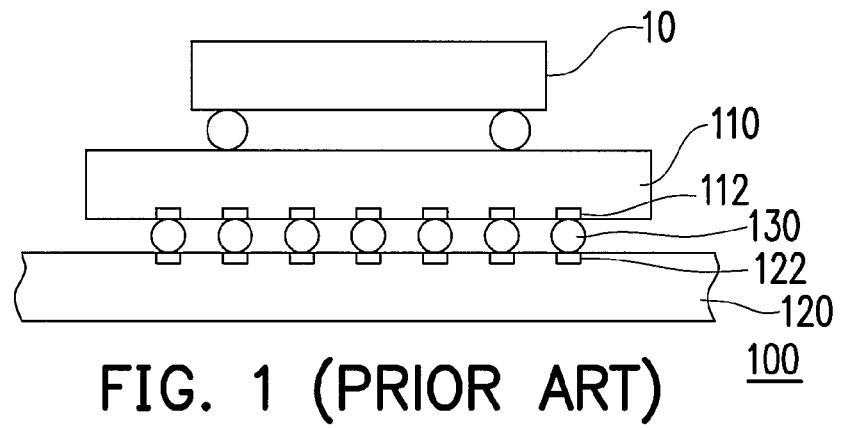
FIG. 1 is a schematic view of a conventional package structure.
Figure 2A:
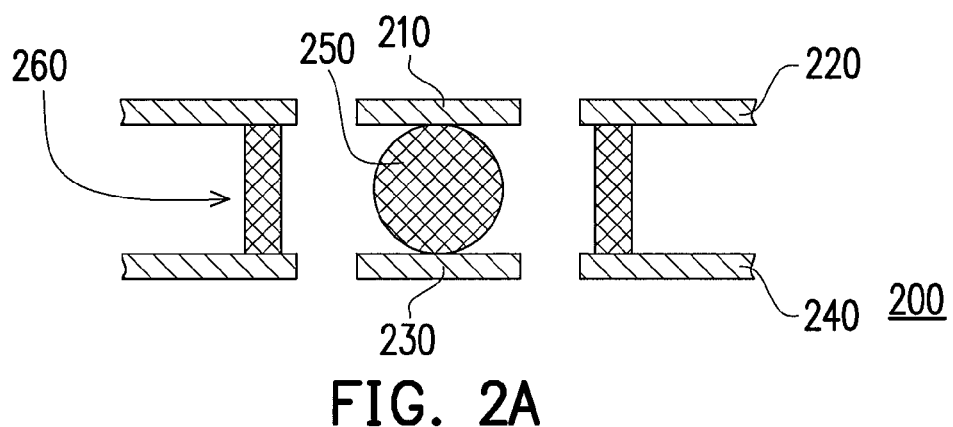
FIG. 2A is a lateral view showing a signal transmission structure according to a preferred embodiment of the present invention.
Figure 2B:
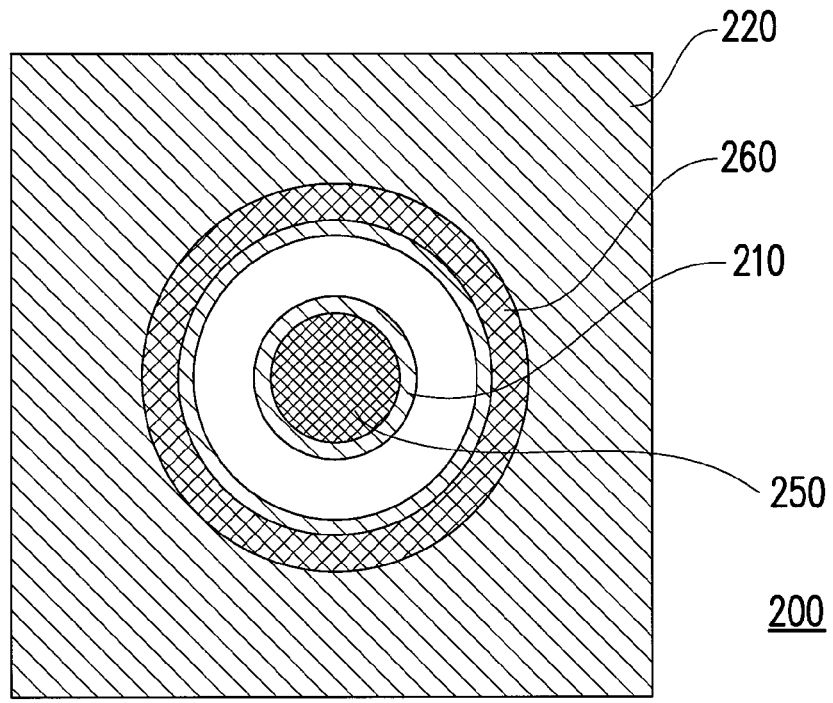
FIG. 2B is a top view showing a signal transmission structure according to a preferred embodiment of the present invention.

FIG. 2A is a lateral view showing a signal transmission structure according to a preferred embodiment of the present invention. FIG. 2B is a top view showing a signal transmission structure according to a preferred embodiment of the present invention. Referring to FIGS. 2A and 2B simultaneously, the signal transmission structure 200 of the present invention includes a first signal pad 210, a first reference plane 220 that is surrounding the first signal pad 210, a second signal pad 230, a second reference plane 240 that is surrounding the second signal pad 230, an electrical conductive element 250 and a conductive wall 260. In the present embodiment, the second reference plane 240 is parallel to the second reference plane 240, wherein the first reference plane 220 and the second reference plane 240 are, for example, ground plane or power plane. In addition, the electrical conductive element 250 is connected between the first signal pad 210 and the second signal pad 220 in order to transmit a signal. The conductive wall 260 is connected between the first reference 220 and the second reference 240 as well as surrounding the electrical conductive element 250. The above mentioned electrical conductive element 250 is, for example, a metal ball and the signal frequency is more than 1 GHz, for example.

In the present embodiment, the conductive wall 260 is connected between the first reference plane 220 and the second reference 240 as well as surrounding the electrical conductive element 250. In a preferred embodiment, the conductive wall 260 can form a sealed space therein, for example. Consequently, the conductive wall 260 can lower the total inductance value ($L_{loop}$) effectively so as to have lower synchronous switching noise (SSN) when signals are transmitting between the two reference planes 220/240 and to further improve the signal transmission quality.

Figure 3:
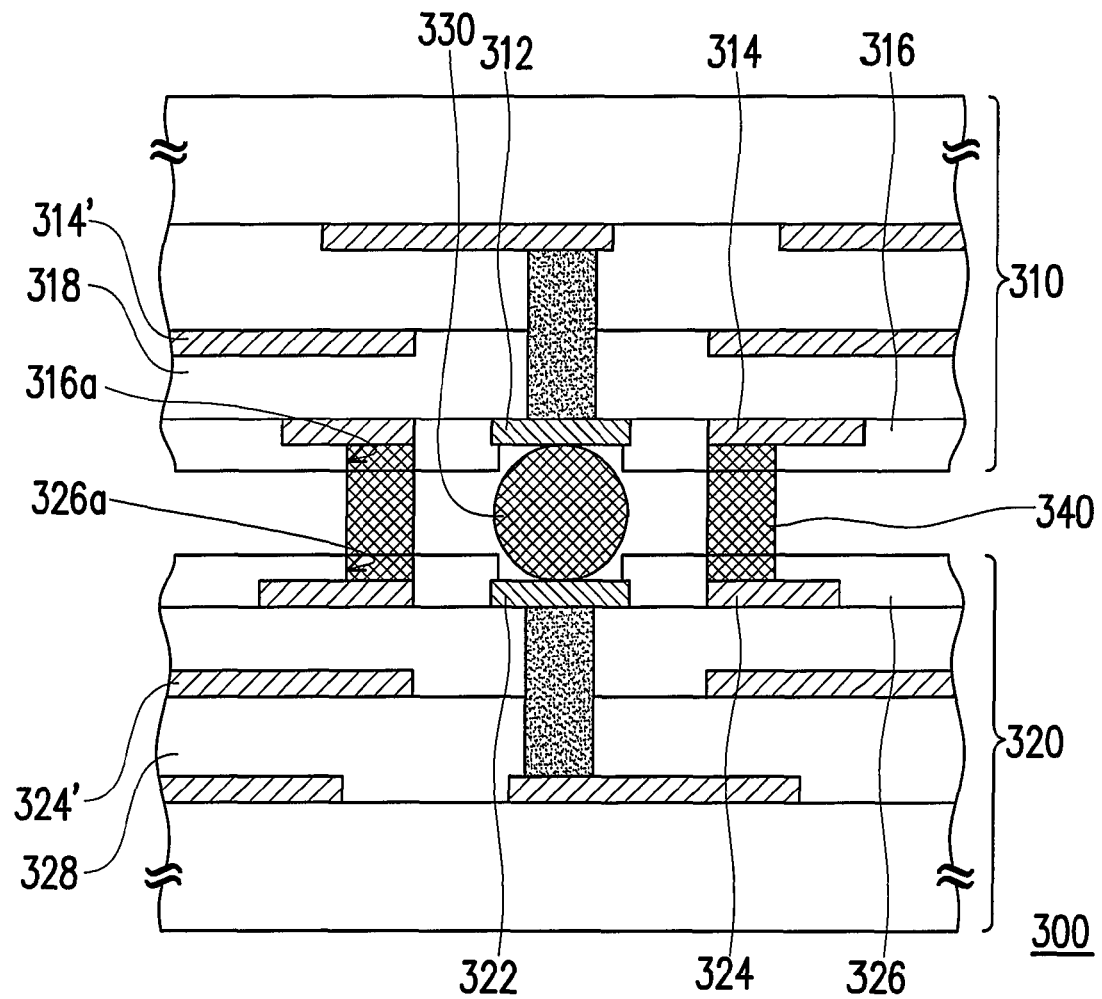
FIG. 3 is a schematic view of a package structure according to a preferred embodiment of the present invention.

Based upon the above, the signal transmission structure recited in the aforementioned embodiment of the present invention can be applied to the semiconductor package technology. FIG. 3 is a schematic view of a package structure according to a preferred embodiment of the present invention. Referring to FIG. 3, the package structure 300 in the present embodiment includes a first substrate 310, a second substrate 320, an electrical conductive element 330 and a conductive wall 340. In the present embodiment, the first substrate 310 includes a first signal pad 312, a first reference plane 314 and a first solder mask layer 316, wherein the first reference plane 314 is surrounding the first signal pad 312 and the first solder mask layer 316 is disposed on the first reference plane 314 and the first signal pad 312 is exposed by the first solder mask layer 316. The first solder mask layer 316 has a first annular opening 316a surrounding the first signal pad 312 to expose a part of the first reference plane 314.

Furthermore, the second substrate 320 includes a second signal pad 322, a second reference plane 324 and a second solder mask layer 326, wherein the second reference plane 324 is surrounding the second signal pad 322 and the second solder mask layer 326 is disposed on the second reference plane 324 and the second signal pad 322 is exposed by the second solder mask layer 326. The second solder mask layer 326 has a second annular opening 326a surrounding the second signal pad 322 to expose a part of the second reference plane 324. Furthermore, the electrical conductive element 330 is connected between the first signal pad 312 and the second signal pad 322 in order to transmit a signal, wherein the electrical conductive element is, for example, a metal ball and the signal frequency is more than 1 GHz, for example. The conductive wall 340 of the present embodiment is connected between the first reference plane 314 exposed by the first solder mask layer 316 and the second reference plane 324 exposed by the second solder mask layer 326 as well as surrounding the electrical conductive element 330, namely, the conductive wall 340 forms a seal space therein.

Based upon the above, the first/second reference planes 314/324 and the first/second signal pads 312/322 recited in the present embodiment are located in the same circuit layer (as shown in FIG. 3); nevertheless, the present invention is not limited to the relative positions of the reference plane and the signal pad, namely, the first/second reference planes 314'/324', and the first/second signal pads 312/322 can be located in different circuit layer respectively. On the other hand, the first/second annular openings 316a/326a of the present embodiment penetrate the first/second solder mask layer 316/326 respectively. In another embodiment, the first/second annular openings 316a/326a, for example, can further penetrate the first/second dielectric layers 318/328 in order to be electrically connected with the first/second reference planes 314'/324'. Furthermore, the aforementioned first substrate 310 or the second substrate 320, for example, is the circuit substrate or printed circuit board (PCB); meanwhile, the first reference plane 314 and the second reference plane 324 are, for example, ground planes or power planes.

The bonding method of the first substrate 310 and the second substrate 320 in the aforementioned package structure 300 is described in detail in the followings.

Figure 4A:
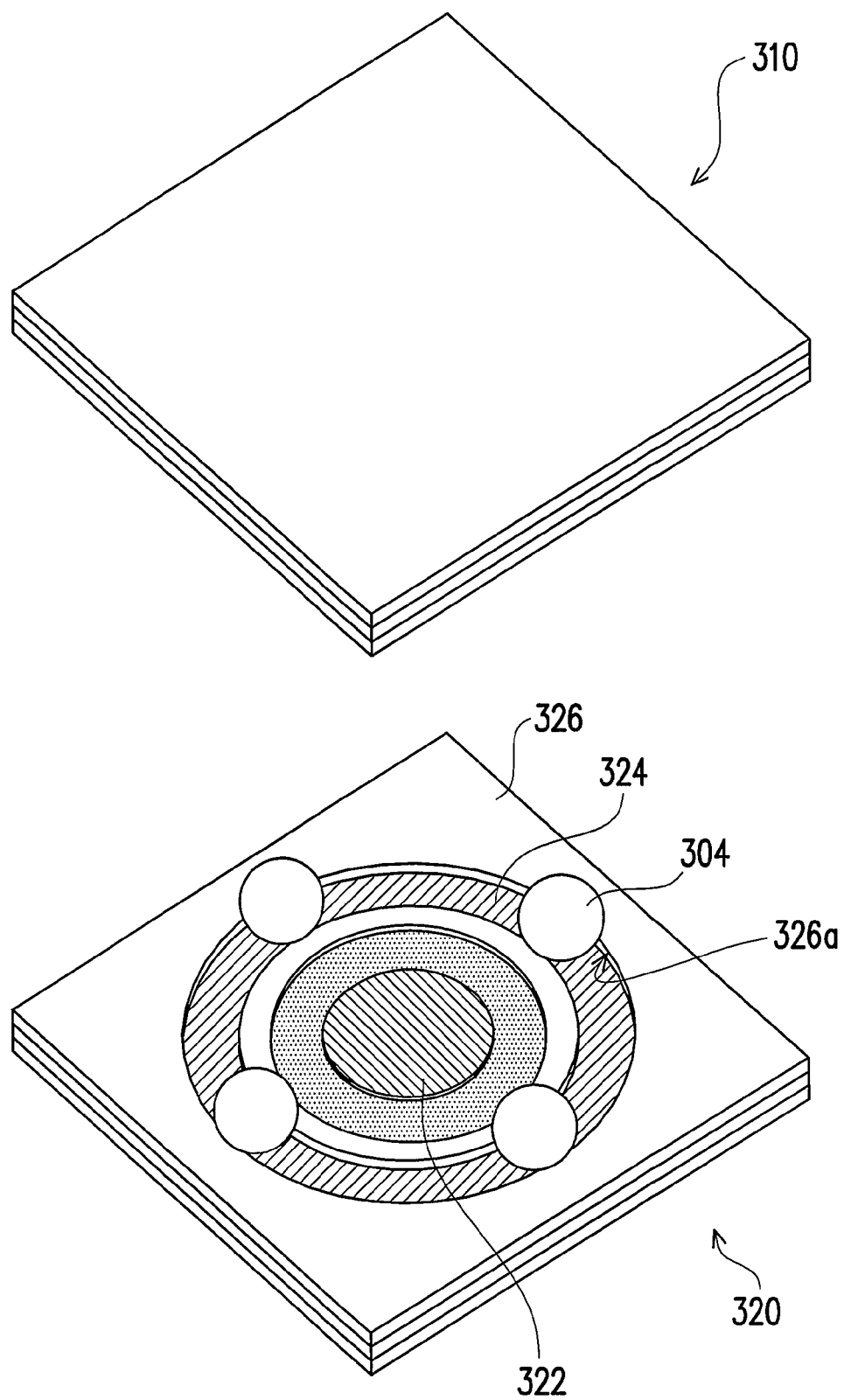
FIG. 4A is a three-dimensional top view showing the first substrate and the second substrate according to a preferred embodiment of the present invention.
Figure 4B:
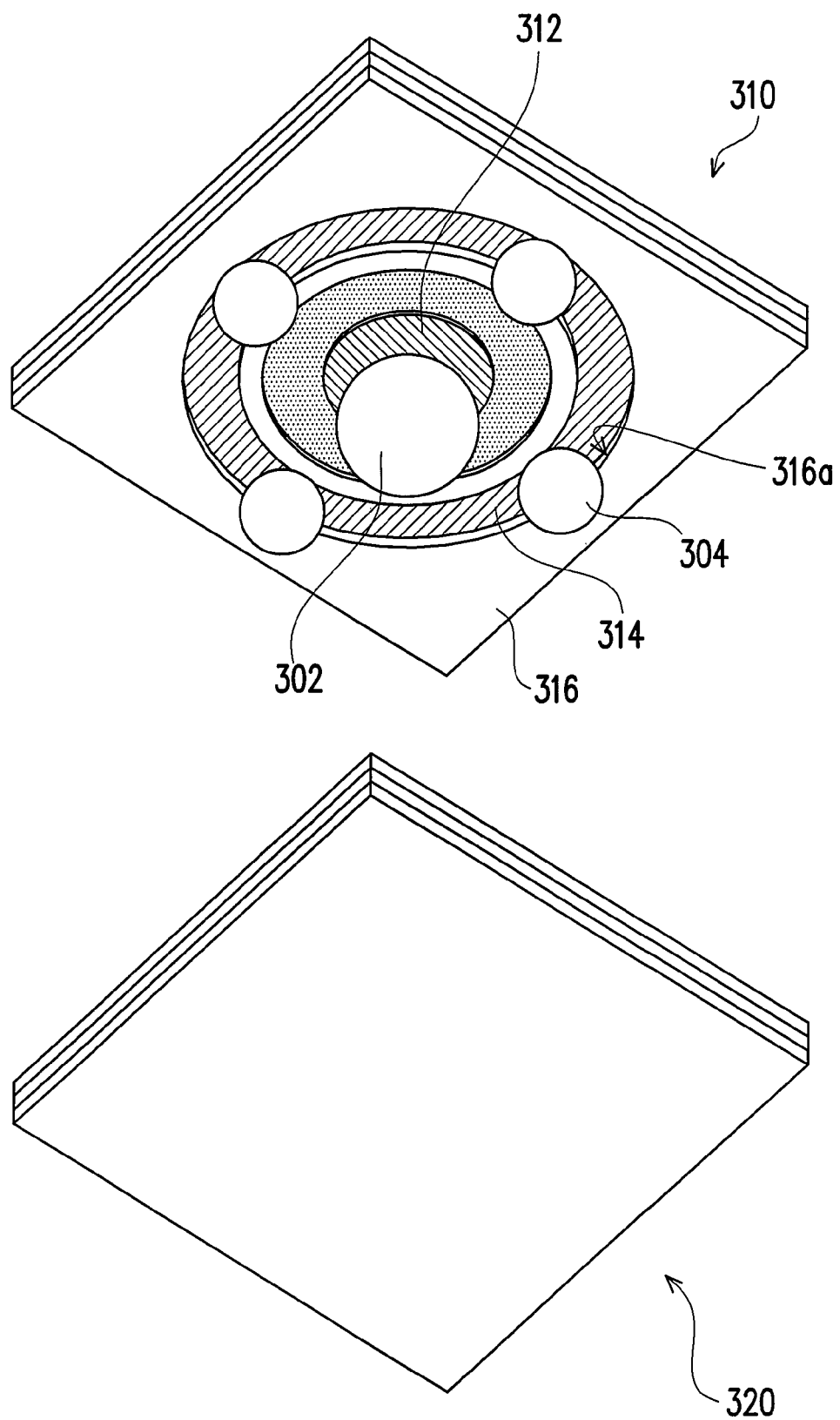
FIG. 4B is a three-dimensional bottom view showing the first substrate and the second substrate according to a preferred embodiment of the present invention.

FIG. 4A is a three-dimensional top view of the first substrate and the second substrate according to a preferred embodiment of the present invention. FIG. 4B is a three-dimensional bottom view of the first substrate and the second substrate according to a preferred embodiment of the present invention. Referring to FIGS. 4A to 4B simultaneously, the present embodiment relates to dispose a first conductive material 302 on the first signal pad 312 and to dispose second conductive materials 304 on the first reference plane 314 surrounding the first conductive material 302. Meanwhile, the present embodiment also relates to dispose second conductive materials 304 on the second reference plane 324 exposed by the second annular opening 326a. In the present embodiment, the method of disposing the first conductive material 302 is, for example, to dispose a first metal ball on the first signal pad 312. Then, the method of disposing the second conductive materials 304 is, for example, to dispose a plurality of the second metal balls on the first/second reference planes 314/324. Specifically, the second conductive materials 304 are disposed on the first/second reference planes 314/324 exposed by the aforementioned first and second annular openings 316a/326a.

Figure 5:
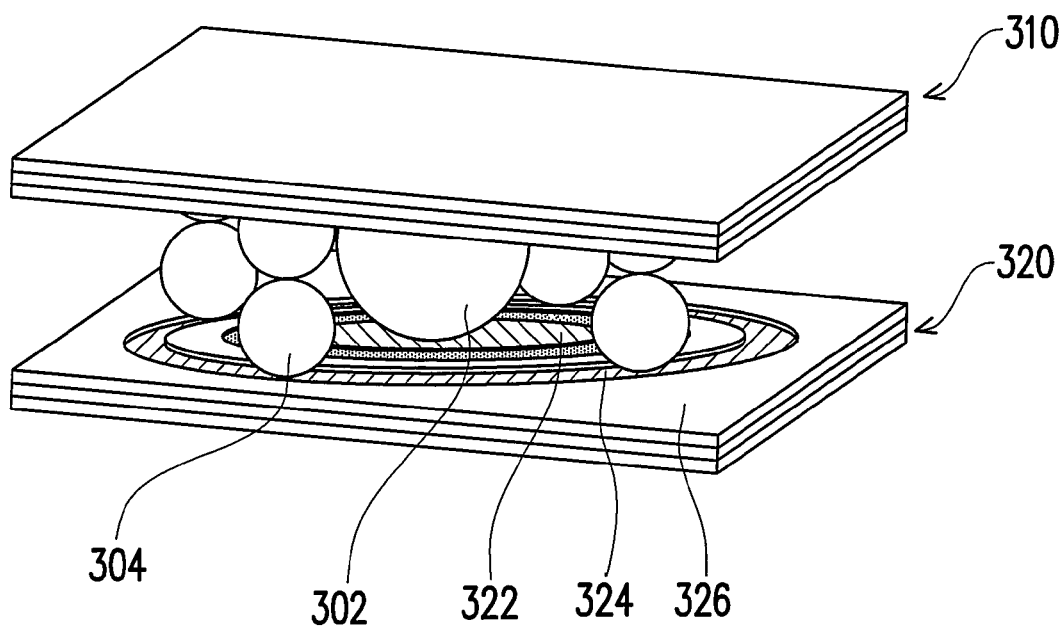
FIG. 5 is a schematic view of bonding the first substrate and the second substrate in FIGS. 4A and 4B.
Figure 6:
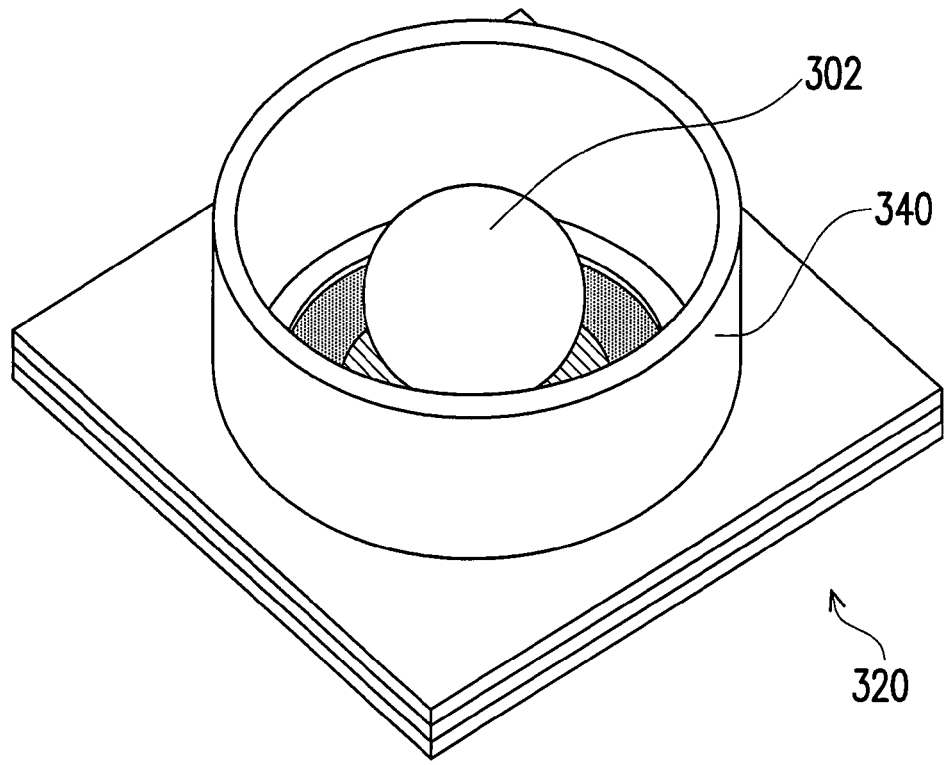
FIG. 6 is a three-dimension diagram of a package structure according to a preferred embodiment of the present invention.

After that, as shown in FIG. 5, the first substrate 310 is bonding with the second substrate 320 in order for the first conductive material 302 (the first metal ball) to be connected between the first signal pad 312 (referring to FIG. 4B) and the second signal pad 322 so as to form the electrical conductive element 330 shown in FIG. 3 and for the second conductive materials 304 to be connected between the first reference plane 314 and the second reference plane 324 so as to form the conductive wall 340 (as shown in FIG. 6) surrounding the first conductive material 302. In the present embodiment, when bonding the first substrate 310 and the second substrate 320, it is possible by means of reflowing the first conductive material 302 so as to make the first conductive material 302 to be in melting state and to be connected between the first signal pad 312 and the second signal pad 322. Similarly, the present embodiment also relates to the second conductive materials 304 (the second metal balls) can be melted by means of reflowing and connected mutually thereafter to form the conductive wall 340 in the package structure 300 as shown in FIG. 6, wherein the first substrate 310 is not shown in FIG. 6 in order to have a clear view. It should be noted that the conductive wall 340 shown in the present embodiment is a sealed conductive wall 340 which is formed after the second metal balls are reflowed. Certainly, in other embodiments, it is not limited that every metal ball should be connected to each other, but the metal balls can respectively form the mutually independent conductive wall which can reduce the noise interference.

Furthermore, it is possible to dispose the first conductive material 302 on the second signal pad 322 so as that the first conductive material 302 on the first signal pad 312 and the first conductive material 302 on the second signal pad 322 form the electrical conductive element 330 (as shown in FIG. 3) connected to the first signal pad 312 and the second signal pad 322 after reflowing. In one preferred embodiment, it is also possible to print solder paste on the first reference plane 314 and the second reference plane 324 respectively in order to form the aforementioned conductive wall. Naturally, the material of conductive wall can also be other type of solder material or conductive material.

Accordingly, the present invention applies to a conductive wall that is surrounding an electrical conductive element connected between the first signal pad and the second signal pad; therefore, the magnitude of the signal transmitting between the first reference plane and the second reference plane will not be effected by the resonant cavity formed between the first reference plane and the second reference plane; namely, such signal has better quality and will not be interfered by the noise of the signal from others. In other words, the signal transmission structure in the present invention provides a good signal transmission quality.

Although the present invention has been disclosed above by the preferred embodiments, they are not intended to limit the present invention. Anybody skilled in the art can make some modifications and alterations within the spirit and scope of the present invention. Therefore, the protecting range of the present invention falls in the appended claims.

What is claimed is:

1. A package structure, comprising:
a first substrate having a first signal pad, a first reference plane and a first solder mask layer, wherein the first reference plane is surrounding the first signal pad and the first solder mask layer is disposed on the first reference plane and the first signal pad is exposed by the first solder mask layer, the first solder mask layer having a first annular opening surrounding the first signal pad to expose a part of the first reference plane;
a second substrate having a second signal pad, a second reference plane and a second solder mask layer, wherein the second reference plane is surrounding the second signal pad and the second solder mask layer is disposed on the second reference plane and the second signal pad is exposed by the second solder mask layer, the second solder mask layer having a second annular opening surrounding the second signal pad to expose a part of the second reference plane;
an electrical conductive element connecting between the first signal pad and the second signal pad so as to transmit a signal; and
a conductive wall connecting between the first reference plane exposed by the first solder mask layer and the second reference plane exposed by the second solder mask layer as well as surrounding the electrical conductive element.

2. The package structure of claim 1, wherein the first reference plane and the second reference plane are ground planes.

3. The package structure of claim 1, wherein the first reference plane and the second reference plane are power planes.

4. The package structure of claim 1, wherein the electrical conductive element comprises a metal ball.

5. The package structure of claim 1, wherein the signal has a frequency more than 1 GHz.

6. The package structure of claim 1, wherein the first substrate is a circuit substrate or a printed circuit board.

7. The package structure of claim 1, wherein the second substrate is a circuit substrate or a printed circuit board.

8. The package structure of claim 1, wherein the conductive wall forms a sealed space therein.

* * * * *